United States Patent
Geffken et al.

(10) Patent No.: US 6,680,514 B1
(45) Date of Patent: Jan. 20, 2004

(54) CONTACT CAPPING LOCAL INTERCONNECT

(75) Inventors: Robert M. Geffken, Burlington, VT (US); David V. Horak, Essex Junction, VT (US); Anthony K. Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 92 days.

(21) Appl. No.: 09/745,047

(22) Filed: Dec. 20, 2000

(51) Int. Cl.[7] ............... H01L 29/76; H01L 29/94; H01L 31/062; H01L 31/113; H01L 31/119
(52) U.S. Cl. ............... 257/368; 257/618; 257/750; 257/758; 257/762; 257/766; 257/773; 257/774
(58) Field of Search ................. 257/368, 750, 257/758, 762, 766, 773, 774, 618

(56) References Cited

U.S. PATENT DOCUMENTS

| | | | |
|---|---|---|---|
| 5,196,373 A | | 3/1993 | Beasom |
| 5,208,170 A | | 5/1993 | Kobeda et al. |
| 5,674,781 A | | 10/1997 | Huang et al. |
| 5,705,857 A | * | 1/1998 | Farooq et al. ............... 257/762 |
| 5,831,899 A | | 11/1998 | Wang et al. |
| 5,850,096 A | | 12/1998 | Izawa et al. |
| 5,877,557 A | * | 3/1999 | Zawaideh ............... 257/748 |
| 5,895,261 A | | 4/1999 | Schinella et al. |
| 5,899,742 A | | 5/1999 | Sun |
| 5,907,781 A | | 5/1999 | Chen et al. |
| 5,920,098 A | | 7/1999 | Liaw |
| 5,920,796 A | | 7/1999 | Wang et al. |
| 5,930,669 A | | 7/1999 | Uzoh |
| 5,965,924 A | | 10/1999 | Yen |
| 5,970,375 A | | 10/1999 | Gardner et al. |
| 5,976,975 A | | 11/1999 | Joshi et al. |
| 5,990,524 A | | 11/1999 | En et al. |
| 6,018,180 A | * | 1/2000 | Cheek et al. ............... 257/344 |
| 6,051,881 A | | 4/2000 | Klein et al. |
| 6,121,659 A | * | 9/2000 | Christensen et al. ......... 257/347 |
| 6,180,506 B1 | * | 1/2001 | Sullivan ............... 438/618 |
| 6,184,143 B1 | * | 2/2001 | Ohashi et al. ............... 438/697 |
| 6,323,554 B1 | * | 11/2001 | Joshi et al. ............... 257/758 |
| 6,333,229 B1 | * | 12/2001 | Furukawa et al. ........... 438/270 |
| 6,333,557 B1 | * | 12/2001 | Sullivan ............... 257/758 |
| 6,521,977 B1 | * | 2/2003 | Burnham et al. ........... 257/649 |
| 6,576,550 B1 | * | 6/2003 | Brase et al. ............... 438/687 |
| 2001/0055840 A1 | * | 12/2001 | Verret ............... 438/142 |

* cited by examiner

*Primary Examiner*—Amir Zarabian
*Assistant Examiner*—Ida M. Soward
(74) *Attorney, Agent, or Firm*—Schmeiser, Olsen & Watts; William D. Sabo

(57) ABSTRACT

A method and structure for forming a metallic capping interface between damascene conductive wires/studs and damascene conductive wiring line structures. The method forms a first insulative layer on a substrate layer, followed by forming damascene conductive wires/studs in the first insulative layer. A lower portion of each damascene conductive wire/stud is in contact with an electronic device (e.g., a field effect transistor), or a shallow trench isolation, that is within the substrate layer. A top portion of the first insulative layer is removed, such as by etching, such that an upper portion of the damascene conductive wires/studs remain above the first insulative layer. A metallic capping layer is formed on the upper portions of the damascene conductive wires/studs such that the metallic capping layer is in conductive contact with the damascene conductive wires/studs. Portions of the metallic capping layer between the damascene conductive wires/studs are removed to form a metallic cap on each damascene conductive wire/stud and to conductively isolate one or more of the damascene conductive wires/studs. A portion of the metallic capping layer may be removed from a particular damascene conductive wire/stud such that no metallic capping material remains conductively coupled to the particular damascene conductive wire/stud. A second insulative layer is formed on the first insulative layer such that the second insulative layer covers the metallic caps. Damascene conductive wiring lines are formed within the second insulative layer above the metallic caps and are conductively coupled to the metallic caps.

28 Claims, 14 Drawing Sheets

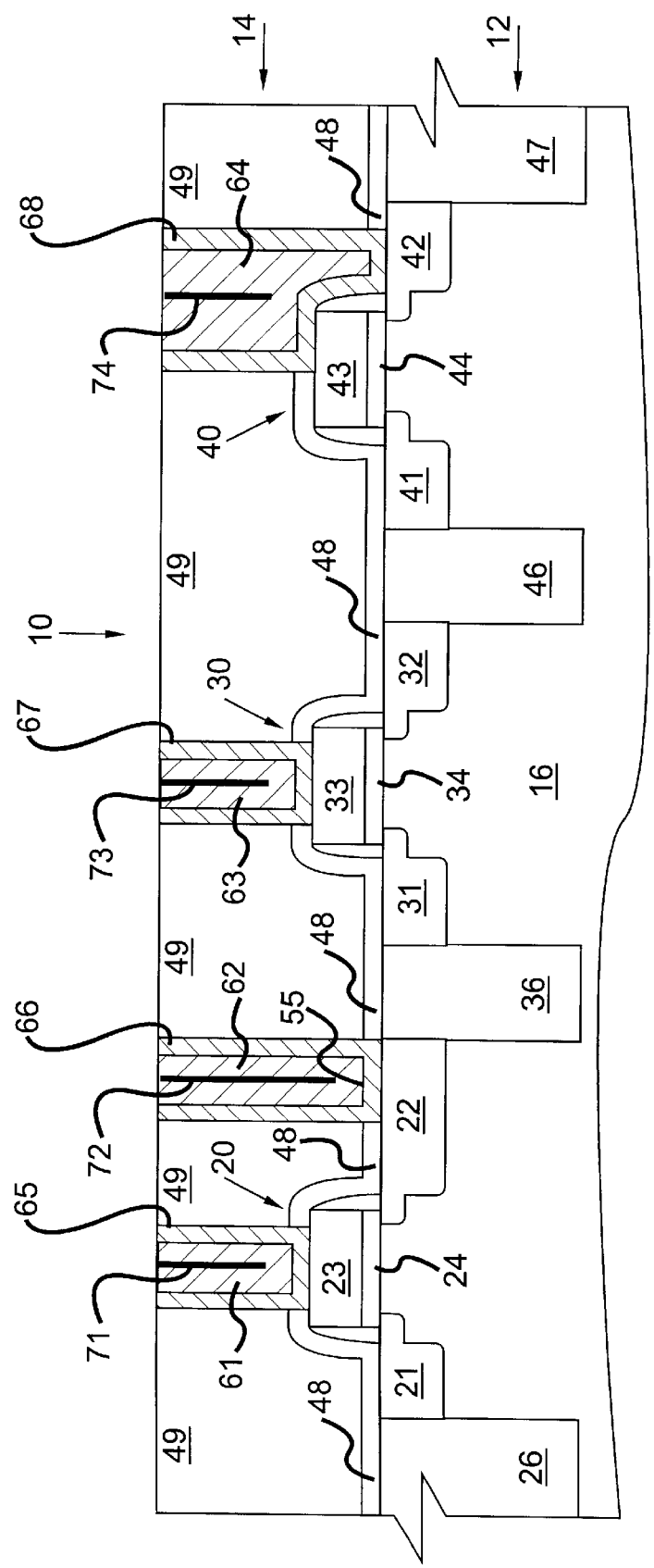
FIG. 3A  *Related Art*

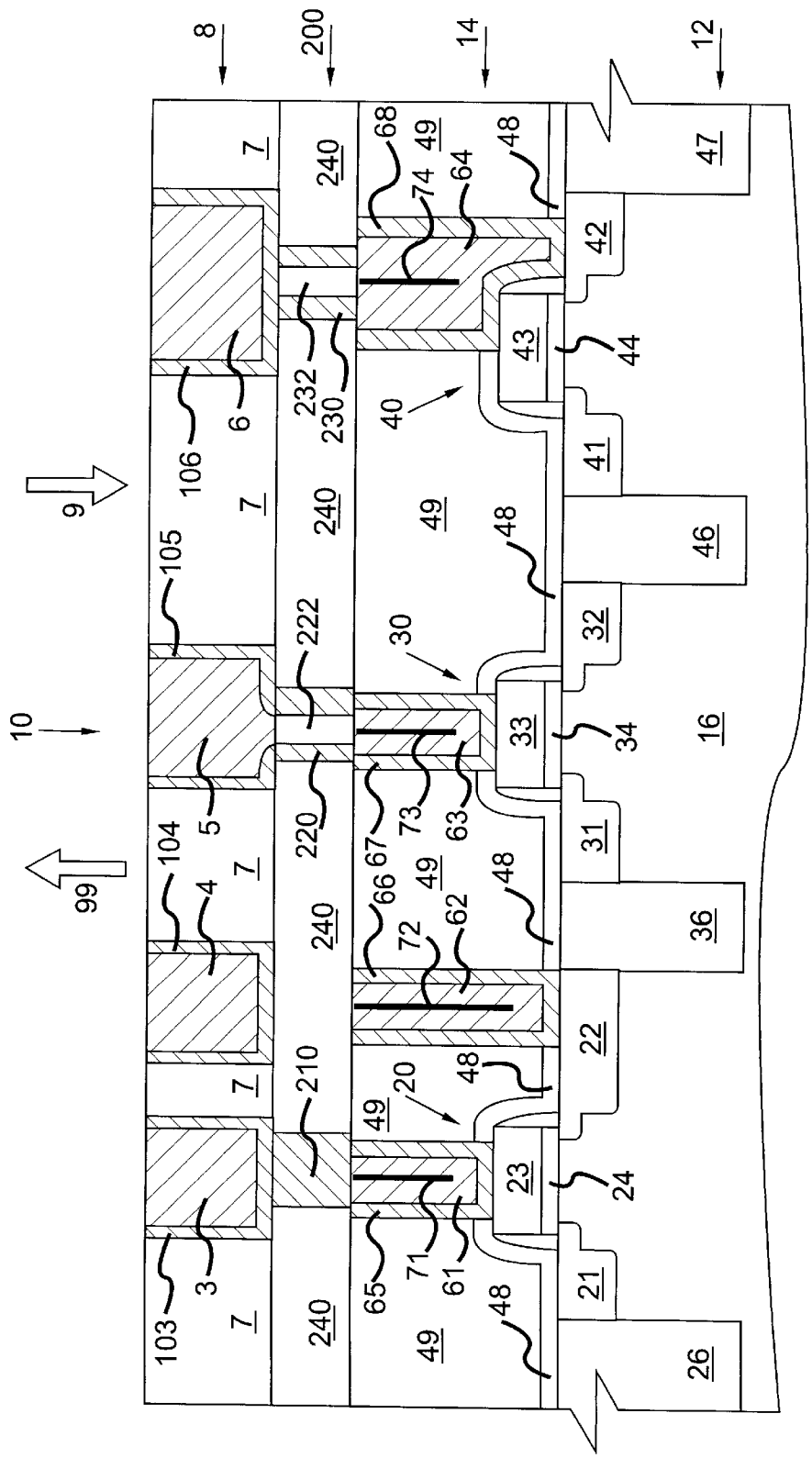
FIG. 3D *Related Art*

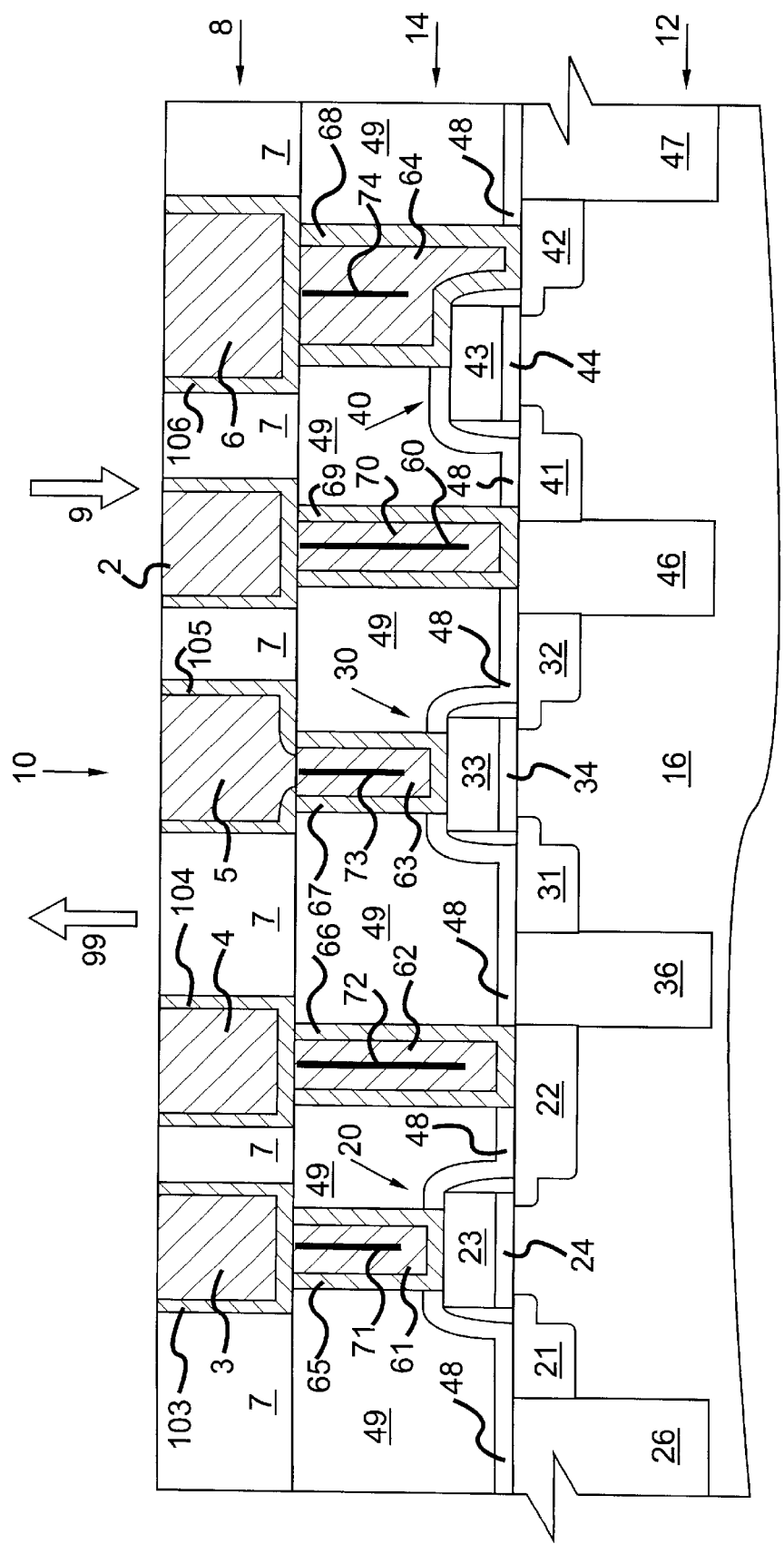
FIG. 3E *Related Art*

CONTACT CAPPING LOCAL INTERCONNECT

BACKGROUND OF THE INVENTION

1. Technical Field

The present invention relates to a method and structure for forming a metallic capping interface between a damascene conductive wire/stud and a damascene conductive wiring level.

2. Related Art

FIG. 1 depicts a front cross-sectional view of an electronic structure 10 having an insulative layer 14 on a substrate layer 12, wherein the insulative layer 14 covers electronic devices that exist within and on the substrate layer 12, in accordance with the related art.

The electronic devices shown in FIG. 1 that exist within and on the substrate layer 12 include a FET 20, a FET 30, and a FET 40. The FET 20 includes a source 21, a drain 22, a gate 23, a gate insulator 24, and insulative spacers 25, wherein the source 21 and the drain 22 my be interchanged in position. The FET 30 includes a source 31, a drain 32, a gate 33, a gate insulator 34, and insulative spacers 35, wherein the source 31 and the drain 32 may be interchanged in position. The FET 40 includes a source 41, a drain 42, a gate 43, a gate insulator 44, and insulative spacers 45, wherein the source 41 and the drain 42 may be interchanged in position. As in addition to, or instead of, including the FET 20, the FET 30, and the FET 40, the substrate layer 12 may include other electronic devices such as, inter alia, bipolar transistors, diodes, etc. The electronic devices (e.g., the FET 20, the FET 30, and the FET 40), are insulatively separated from one another by insulative barriers, such as, inter alia, the shallow trench isolations 26, 36, 46, and 47.

The insulative layer 14 may include, inter alia, a insulative material 49 such as phososilicate glass (PSG) or borophosilicate glass (BPSG) formed by any method known to one of ordinary skill in the art such as by high density plasma chemical vapor deposition (HDPCVD), plasma enhanced CVD, ozone/TEOS CVD, LPCVD, etc. The thickness of the insulative layer 14 is between about 0.2 microns and about 1.5 microns and a representative thickness in the aforementioned thickness range is about 0.5 microns. A passivating layer 48 (e.g., a silicon nitride or a silicon carbide layer) may be formed on the substrate layer 12 prior to forming the insulative layer 14. The passivating layer 48 may act as an etch stop layer during a subsequent reactive ion etching (RIE) of trenches or vias 51, 52, 53, and 54 as described infra in conjunction with FIG. 2. The passivating layer 48 may also act as a mobile ion barrier, and/or as a copper diffusion barrier, or a diffusion barrier of any other metal, for protecting the substrate layer 12 and the electronic devices (i.e., the FET's 20, 30, and 40) from subsequent etching of trenches or vias into the insulative material 49 as described infra in conjunction with FIG. 2, or from moble ions or metals (e.g., Na, Cu, etc.) diffusing into the electronic devices (i.e., the FET's 20, 30, and 40).

FIG. 2 depicts FIG. 1 after trenches or vias 51, 52, 53, and 54 have been etched in the insulative layer 14, exposing a portion of each electronic device (i.e., the FET's 20, 30, and 40). The process for forming the trenches or vias 51, 52, 53, and 54 may be any process known to one of ordinary skill in the art such as, inter alia, reactive ion etch (RIE) using perfluoro carbon-based or related (i.e., $CH_XF_Y$, $S_XF_X$, etc.) selective etching or non-selective etching. The process for forming the trenches or vias 51, 52, 53, and 54 removes portions of both the insulative layer 14 and the passivating layer 48. The trenches or vias 51, 52, 53, and 54 may be of the same width or of different widths. The trenches or vias 51, 52, 53, and 54 serve as a template for forming conductive wires/studs (i.e., wires are formed in trenches and vias provide a conductive path that connect different wiring levels of a multilevel wiring structure) as will be described infra in conjunction with FIG. 3A. Unless otherwise stated, "conductive" herein means "electrically conductive."

FIG. 3A depicts FIG. 2 after the trenches or vias 51, 52, 53, and 54 have been filled with conductive material to form conductive wires/studs 61, 62, 63, and 64, respectively, that conductively contact the electronic devices (i.e., the FET's 20, 30, and 40). The conductive wires or studs 61, 62, 63, and 64 may includes any one or more conductive materials such as a semiconductor material (e.g., polysilicon), a metal (e.g., tungsten, tantalum, aluminum, TiN, copper, etc.), or a metallic alloy. Although any of preceding conductive materials may be used, an optimal conductive material is tungsten, which is typically is deposited over thin refractory conductive liners 65, 66, 67, and 68, as will be discussed infra. The conductive material may be formed by a method such as chemical vapor deposition (CVD), physical vapor deposition (PVD), etc., that grows the conductive material from the bottom and sidewalls of the trenches or vias 51, 52, 53, and 54. The conductive wires/studs 61, 62, 63, and 64 which include the conductive material are damascene wires/studs and collectively constitute a damascene wiring level. The conductive material so grown merges together from the bottom and sidewalls of the trenches or vias 51, 52, 53, and 54 to typically form internal seams or voids 71, 72, 73, and 74, respectively. The seams or voids 71, 72, 73, and 74 are oriented lengthwise (i.e., approximately in a direction 99) within the conductive wires/studs 61, 62, 63, and 64, respectively. The seams or voids 71, 72, 73, and 74 may extend from above bottom surfaces of the conductive wires/studs 61, 62, 63, and 64 (e.g., from above a bottom surface 55 of the conductive wire/stud 62) to top surfaces of the conductive wires/studs 61, 62, 63, and 64, respectively (e.g., to a top surface 56 of the conductive wire/stud 62). The seams or voids 71, 72, 73, and 74 are problematic as will be discussed infra in conjunction with FIG. 3B and FIG. 3D. The seams or voids 71, 72, 73, and 74 in the wire/studs 61, 62, 63, and 64, respectively, can be magnified or exacerbated by the chemical mechanical polish, etchback, and/or post planarization cleans used for damascening the metal in the trenches. The post planarization cleans can include either wet chemical etching or reactive ion etching.

Additionally, conductive liners 65, 66, 67, and 68 may be formed on the bottom and sidewalls of the trenches or vias 51, 52, 53, and 54, respectively, as shown. The conductive liners 65, 66, 67, and 68 include one or more conductive materials such as refractory metals and nitrides thereof (e.g., such as titanium, titanium nitride, etc). The conductive wire/stud 61 is conductively coupled to the gate 23 of the FET 20. The conductive wire/stud 62 is conductively coupled to the drain 22 of the FET 20. The conductive wire/stud 63 is conductively coupled to the gate 33 of the FET 30. The conductive wire/stud 64 is conductively coupled to the gate 43 and drain 42 of the FET 40. The conductive wires/studs 61, 62, 63, and 64 could alternatively be conductively coupled to source rather than drain of the FET's 20, 30, and 40 if the positions of the sources 21, 31, and 41 were respectively interchanged with the drains 22, 32, and 42 of the FET's 20, 30, and 40, respectively.

The filling of the trenches or vias 51, 52, 53, and 54 with the conductive material may be followed with polishing, such as by chemical mechanical polishing (CMP), or any other suitable method (e.g., etchback using a $SF_6$ based plasma), that planarizes the top surface 17 of the insulative layer 14 and the conductive wires/studs or interconnects 61, 62, 63, and 64, and removes excess metal from the top surface 17.

FIG. 3B depicts FIG. 3A after a damascene copper wiring layer 8 has been formed on the insulative layer 14 and the conductive wires/studs 61, 62, 63, and 64. The damascene copper wiring layer 8 includes copper wiring lines 3, 4, 5, and 6, which are in conductive contact with the conductive wires/studs 61, 62, 63, and 64, respectively. The damascene copper wiring layer 8 also includes insulation 7 which insulatively separates the copper wiring lines 3, 4, 5, and 6 from one another. In order to form the copper wiring lines 3, 4, 5, and 6, trenches or vias which will include the copper of the copper wiring lines 3, 4, 5, and 6 must first be formed in the insulation. Said trenches in the insulation 7 may be formed by any method that was described supra for forming the trenches 51, 52, 53, and 54 in the insulative layer 14 of FIG. 2. After said trenches have been formed in the insulation 7, the copper of the wiring lines 3, 4, 5, and 6 may be formed as follows.

The copper wiring lines 3, 4, 5, and 6 are typically deposited respectively using one or more CVD or PVD refractory metal liners 103, 104, 105, and 106 (~5 to 25% of the line volume) such as TiN/Ta (i.e., a titanium nitride film and a tantalum film, deposited sequentially), followed by a copper deposition using damascene copper electroplating. The copper that will form the copper wiring lines 3, 4, 5, and 6 is commonly deposited using a two-step sequence comprising: (1) depositing a thin copper seed layer using, inter alia, evaporation, PVD, ionized physical vapor deposition (IPVD), CVD, or electroless plating; and (2) depositing electroplated copper on the thin seed layer. Because the vias or troughs where the copper is plated can have high aspect ratios (i.e., the aspect ratio is defined as the height of the opening to the width of the opening), one or more of the refractory metal liners 103, 104, 105, and 106, and one or more of the aforementioned copper seed layers can have poor step coverage at the via or trough bottom (i.e., the via or trough bottom thickness is less than the via or trough nominal thickness). This poor step coverage at the via or trough bottom means that the seam or void in the trenches or vias 51–54 can be exposed to the copper plating solution, which is exemplified in FIG. 3B for the copper lining 5 and the associated refractory metal liner 105. If copper plating solution accesses the seam or void in the metallized trench or via (e.g., the seam or void 73 within the conductive wires/studs 63 in the trench or via 53), then copper from the copper plating solution can become trapped inside the seam or void (e.g., the seam or void 73 within the conductive wires/studs 63 in the trench or via 53). Unfortunately, the plating solution trapped in some or all the seams or voids 71, 72, 73, and 74, within the conductive wires/studs 61, 62, 63, and 64, respectively, may expand or vaporize so as to deform, damage, or even blow up said some or all of the conductive wires/studs 61, 62, 63, and 64, during subsequent high temperature thermal processing (i.e., at a temperature above about 100° C.). FIG. 3C depicts a top view of the conductive wiring line 3 of FIG. 3B over the associated conductive wire/stud 61 having the seam or void 71.

As an alternative illustration of the related art problems associated with the seams or voids of FIG. 3B (e.g., the seam or void 73 within the conductive wire/stud 63 in the trench or via 53 in FIG. 3B as discussed supra), FIG. 3D depicts FIG. 3B with a damascene contact or via level 200 disposed between the damascene copper wiring layer 8 of FIG. 3B and the conductive wires/studs 61, 62, 63, and 64 of FIG. 3B. The damascene contact or via level 200 in FIG. 3D includes insulation 240 and damascene wires/studs 210, 220, and 230, which respectively conductively couple the copper wiring lines 3, 5, and 6 to the conductive wires/studs 61, 63, and 64. The damascene wire/stud 220 includes a via 222, and the damascene wire/stud 230 includes a via 232. The via 222 provides a conduit from the copper wiring lines 5 to the seam or void 73 within the conductive wire/stud 63 in the trench or via 53. The conduit of the via 222 exposes the seam or void 73 within the conductive wire/stud 63 in the trench or via 53 to the copper plating solution associated with the copper wiring line 5 of the copper wiring layer. Thus, the damascene contact or via level 200 of FIG. 3D has a potential for enabling plating solution to be trapped in some or all the seams or voids 71, 72, 73, and 74, within the conductive wires/studs 61, 62, 63, and 64, respectively.

FIG. 3E illustrates FIG. 3B with an additional conductive wire/stud 60 having a conductive liner 69 and a seam or void 70, wherein the additional conductive wire/stud 60 is on the shallow trench isolation 46, and wherein an additional copper wiring line 2 of the damascene copper wiring layer 8 of FIG. 3B is on the additional conductive wire/stud 60. The additional conductive wire/stud 60 has similar physical and chemical properties, and may be similarly formed, as described supra in conjunction with FIGS. 2 and 3A for the conductive wires/studs 61, 62, 63, and 64. The additional copper wiring line 2 has similar physical and chemical properties, and may be similarly formed, as described supra in conjunction with FIG. 3B for the copper wiring lines 3, 4, 5, and 6.

A structure and method is needed for preventing copper plating solution from the damascene copper wiring layer 8 from deforming, damaging, or blowing up any or all of the conductive wires/studs 60, 61, 62, 63, and 64 (see FIG. 3B, 3D, and 3E) which are located below the damascene copper wiring layer 8 (i.e., displaced from the damascene copper wiring layer 8 in a direction 9).

SUMMARY OF THE INVENTION

The present invention provides an electronic structure, comprising:
 a substrate layer that includes a first electronic device;
 a first insulative layer on the substrate layer;
 a first damascene conductive wire/stud having a lower portion in the first insulative layer and an upper portion above the first insulative layer;
 a subtractive etch metallic cap on the upper portion of the first damascene conductive wire/stud and in conductive contact with the first damascene conductive wire/stud;
 a second insulative layer on the first insulative layer, wherein the second insulative layer covers the subtractive etch metallic cap; and
 a damascene conductive wiring line structure within the second insulative layer such that the damascene conductive wiring line structure is above the subtractive etch metallic cap and is conductively coupled to the subtractive etch metallic cap.

The present invention provides a method for forming an electronic structure, comprising the steps of:
 providing a substrate layer that includes a first electronic device;
 forming a first insulative layer on the substrate layer;
 forming a first damascene conductive wire/stud in the first insulative layer;

removing a top portion of the first insulative layer such that an upper portion of the first damascene conductive wire/stud is above the first insulative layer after said removing;

forming a metallic capping layer on the first insulative layer such that the metallic capping layer is in conductive contact with the first damascene conductive wire/stud;

subtractively etching a portion of the metallic capping layer to form a subtractive etch metallic cap on the upper portion of the first damascene conductive wire/stud such that the subtractive etch metallic cap is in conductive contact with the first damascene conductive wire/stud;

forming a second insulative layer on the first insulative layer, wherein the second insulative layer covers the subtractive etch metallic cap; and forming a damascene conductive wiring line structure within the second insulative layer such that the damascene conductive wiring line structure is above the subtractive etch metallic cap and conductively coupled to the subtractive etch metallic cap.

The present invention provides a structure and method for preventing copper plating solution from a damascene copper wiring layer from deforming, damaging, or blowing up conductive wires/studs located below the copper wiring layer.

BRIEF DESCRIPTION OF THE DRAWINGS

FIG. 3A depicts FIG. 2 after the trenches or vias have been filled with conductive material to form conductive wires/studs with seams or voids such that the conductive wires/studs conductively contact the electronic devices.

FIG. 3D depicts FIG. 3B with a damascene contact or via level disposed between the copper wiring layer of FIG. 1B and the conductive wires/studs of FIG. 3B.

FIG. 3E depicts FIG. 3B with an additional conductive wire/stud having a seam or void, wherein the additional conductive wire/stud is on a shallow trench isolation within the substrate layer, and wherein an additional damascene conductive wiring line of the copper wiring layer of FIG. 3B is on the additional conductive wire/stud.

DETAILED DESCRIPTION OF THE INVENTION

Figure 3B:
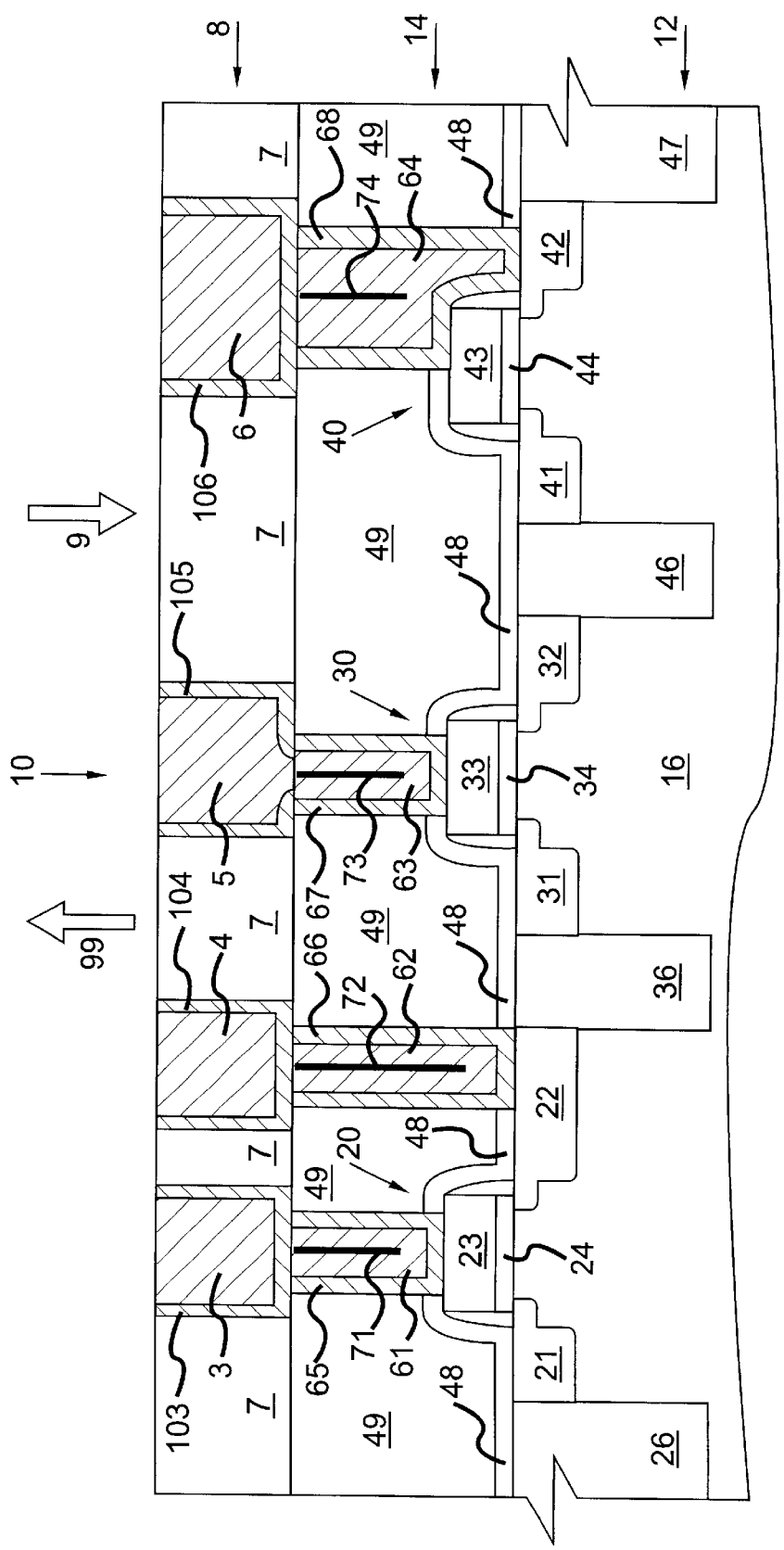
FIG. 3B depicts FIG. 3A after a copper wiring layer has been formed in the first insulative layer and on the conductive wires/studs.
Figure 3C:
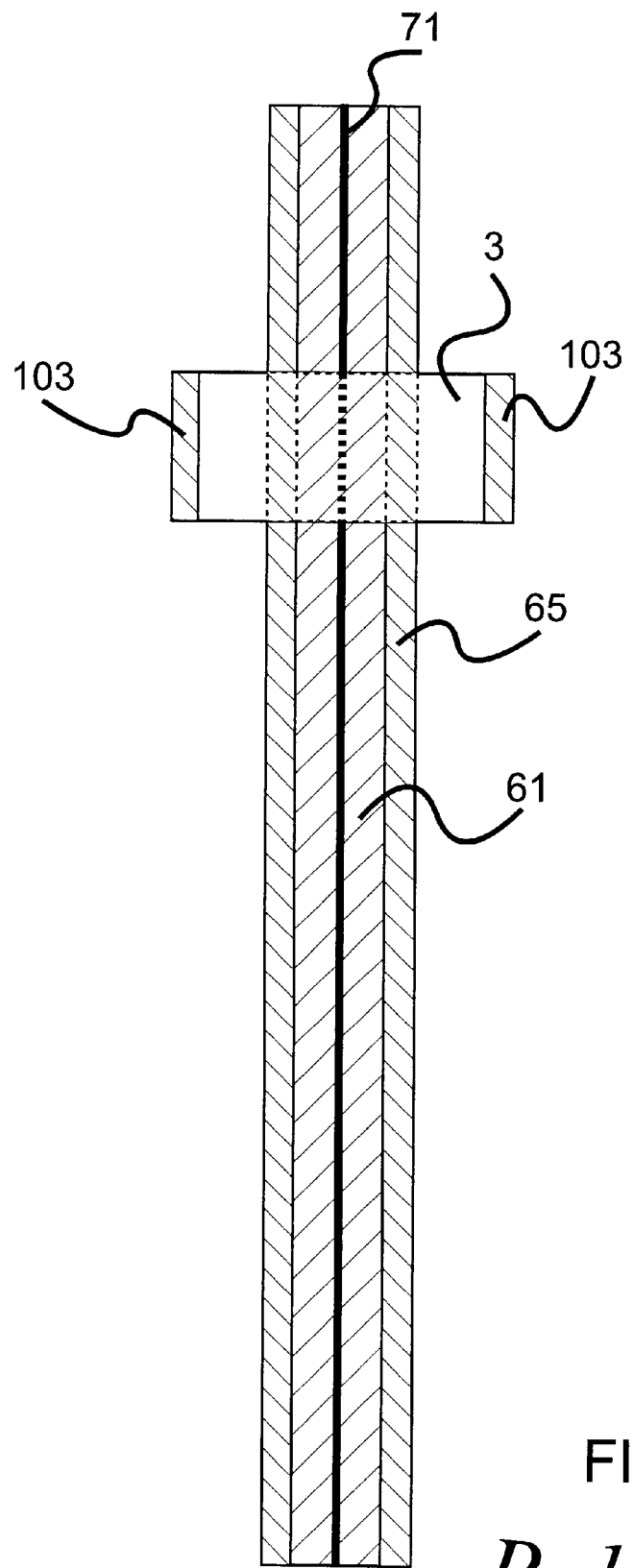
FIG. 3C depicts a top view of a conductive wiring line of the copper wiring layer of FIG. 3B over an associated conductive wire/stud having the seam or void.
Figure 4:
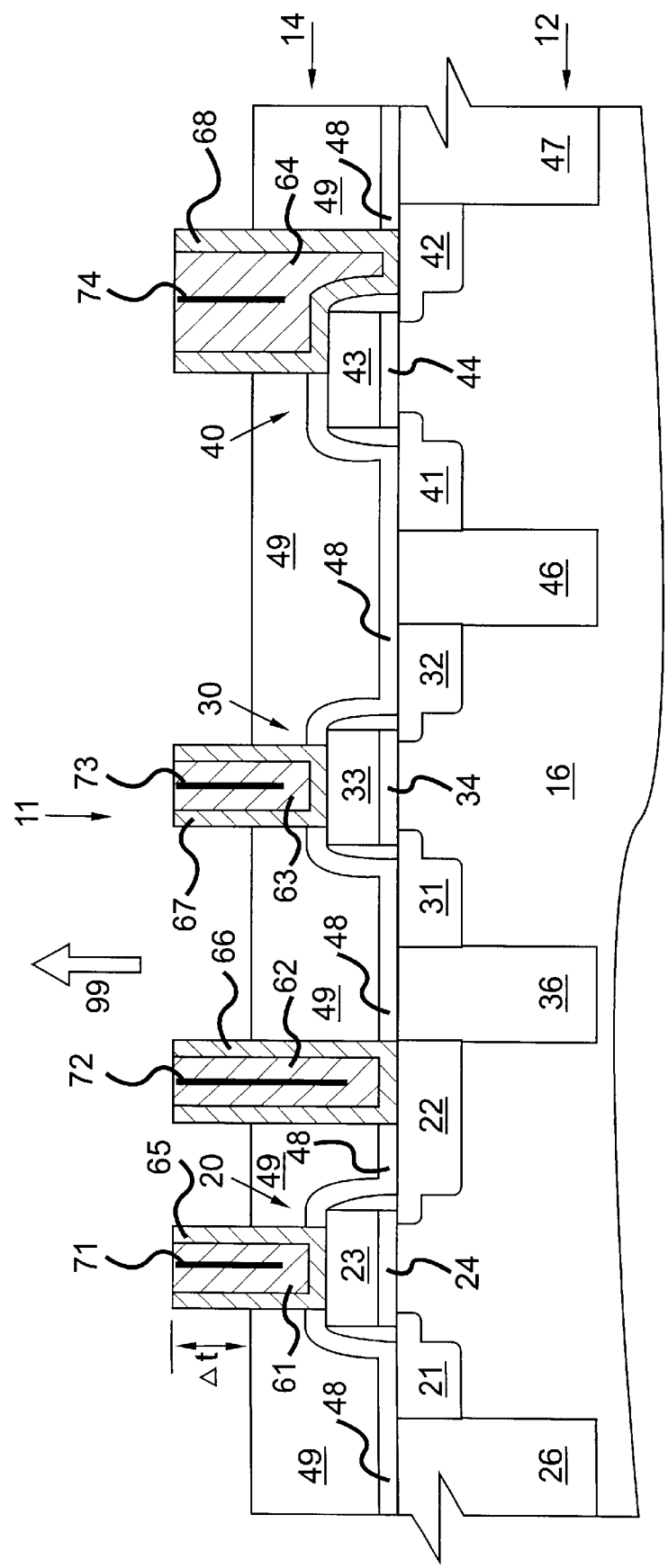
FIG. 4 depicts a front cross-sectional view of a second electronic structure resulting from removal of a top portion of the first insulative layer of FIG. 3A, which exposes top portions of the conductive wires/studs, in accordance with embodiments of the present invention.

FIG. 4 illustrates a front cross-sectional view of an electronic structure 11 resulting from removal of a top portion of the insulative layer 14 of FIG. 3A, in accordance with embodiments of the present invention. As stated supra in conjunction with FIG. 3A, the conductive wires/studs 61, 62, 63, and 64 are damascene wires/studs which collectively constitute a damascene wiring level. The removal of the top portion of the insulative layer 14 reduces a thickness of the insulative layer 14 to between about 100 nm and about 1000 nm with a representative thickness of about 250 nm, and exposes top portions of the conductive wires/studs 61, 62, 63, and 64. With the 250 nm reduced thickness of the insulative layer 14, a distance $\Delta t$ between a top surface of the conductive wire/stud 61 and a top surface of the insulative layer 14 is between about 100 nm and about 400 nm. If the reduced thickness of the insulative layer 14 were greater than the 250 nm, then the distance $\Delta t$ would be in a range whose endpoints are respectively greater than the endpoints 100 nm and 400 nm of the aforementioned 100–400 nm range. The conductive wires/studs 61, 62, 63, and 64, as used in accordance with the present invention, are each oriented approximately in the direction 99, and each has an arbitrary cross sectional shape in a plane that is about normal to the direction 99. The conductive wires/studs 61, 62, 63, and 64 serve to conductively interconnect the electronic devices (i.e., the FET's 20, 30, and 40) to other conductive structure within, or external to, the electronic structure 11. While FIG. 4, as well as FIGS. 5–9 to be discussed infra, show electronic devices as the FET's 20, 30, and 40, other electronic devices could be utilized instead of, or in addition to, the FET's 20, 30, and 40. Such other electronic devices include, inter alia, an MOS capacitor, a resistor, an inductor, a charged coupled device, and a light emitting diode.

The removal of the top portion of the insulative layer 14 in FIG. 4 may be accomplished by any method known to one of ordinary skill in the art such as, inter alia, reactive ion etching (RIE) using perfluoro carbon-based etching or related (i.e., $CH_xF_y$, $S_xF_x$, etc.). Following the RIE, residual polymer may be cleaned up using an oxygen type plasma cleanup (e.g., using oxygen, ozone, NO, $NO_2$, CO, $CO_2$, etc., perhaps diluted in argon, and perhaps including low flows of $CF_4$ or similar gas, as is known in the art). As an alternative to (or as a follow-up to) the RIE, a surface cleaning may be done by wet chemical etching (e.g., treating with chromic/phosphoric acid or hydrofluoric acid), or other solvent (e.g., acid or base) treatment. After the cleaning, a degassing step may be performed for degassing any residual gas (e.g., solvent) in the insulative layer 14. The degassing may be accomplished by, inter alia, heating the electronic structure 11 in a vacuum to a temperature ranging from about 150° C. to about 400° C. (nominally about 350° C.) for about 2 minutes.

Figure 5:
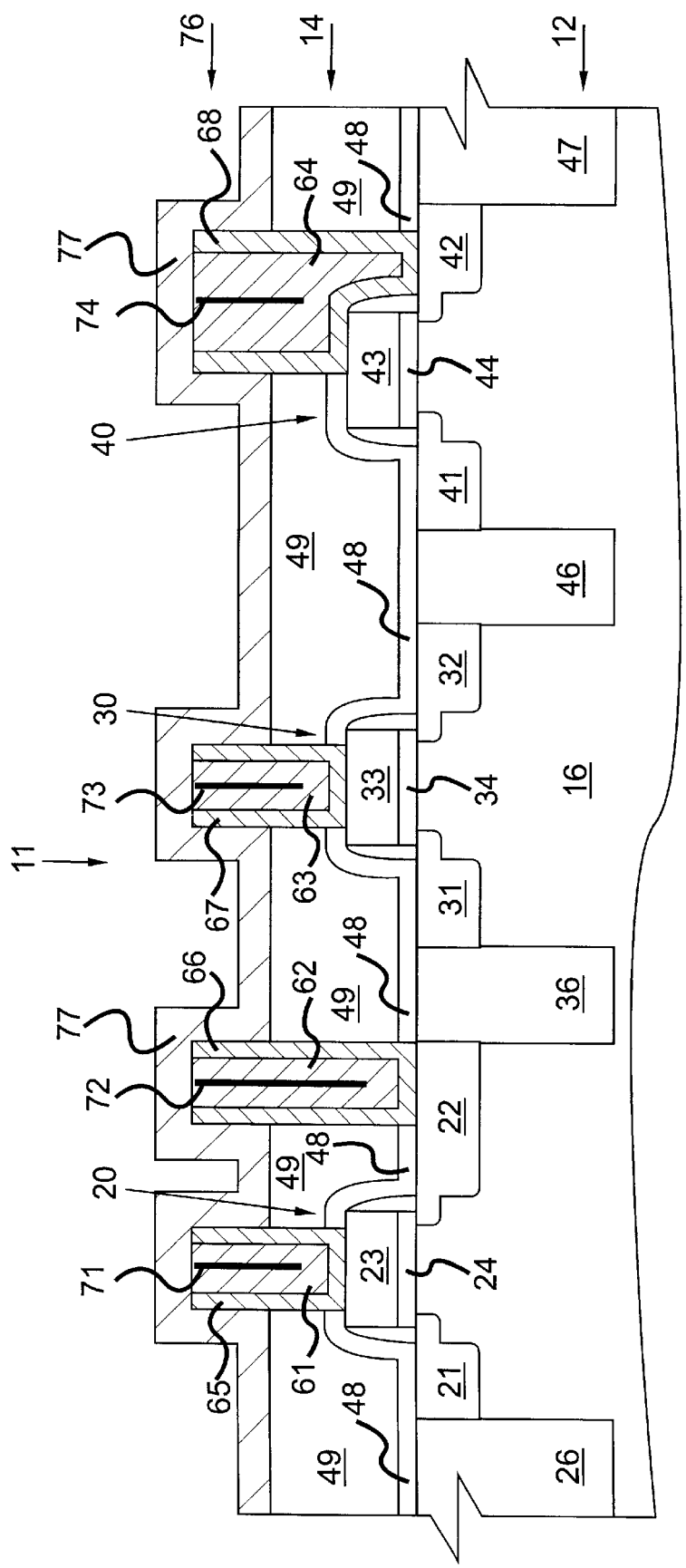
FIG. 5 depicts FIG. 4 after a metallic capping layer has been formed on the first insulative layer and is in conductive contact with the conductive wires/studs.

FIG. 5 illustrates FIG. 4 after a metallic capping layer 76 has been formed on the insulative layer 14 and is in conductive contact with the conductive wires/studs 61, 62, 63, and 64. The metallic capping layer 76 may serve as a local interconnect wire for conductively coupling the interconnects 61, 62, 63, and 64 with other conductive structure such the conductive wiring level 90 (e.g., a copper wiring level) discussed infra in conjunction with FIG. 8. Returning to FIG. 5, the metallic capping layer 76 includes a low-resistance metallic capping material 77 such as, inter alia, one or more of tungsten, tantalum, aluminum with copper doping, tantalum nitride, titanium nitride, tungsten nitride, gold, silver, platinum, copper, palladium, etc. A low-resistance phase of tantalum may be generated such as by forming a relatively thin (e.g., 10 nm) layer of tantalum nitride (TaN) followed by forming a relatively thick (e.g., 200 nm) layer of Ta on the relatively thin layer of TaN. Similarly, a low-resistance phase of titanium may be generated such as by forming a relatively thin layer of titanium nitride followed by forming a relatively thick layer of titanium on the relatively thin layer of titanium nitride; and a low-resistance phase of tungsten may be generated such as by forming a relatively thin layer of tungsten nitride followed by forming a relatively thick layer of tungsten on the relatively thin layer of tungsten nitride. Copper be also be used for the low-resistance metallic capping material 77, but copper is not as good as the aforementioned conductive materials, because copper is difficult to selectively remove such as by subtractive etching. A thickness of the low-resistance metallic capping material 77 is between about 50 nm and about 300 nm and a representative thickness in the aforementioned thickness range is about 100 nm.

The metallic capping layer 76 may be formed by depositing the low-resistance metallic capping material 77 by any method known to one of ordinary skill in the art such as, inter alia, physical vapor deposition (PVD) (e.g., standard PVD or ionized PVD), chemical vapor deposition (CVD), evaporation, sputtering, a spin-on method, a sol-gel method, etc.

Figure 6:
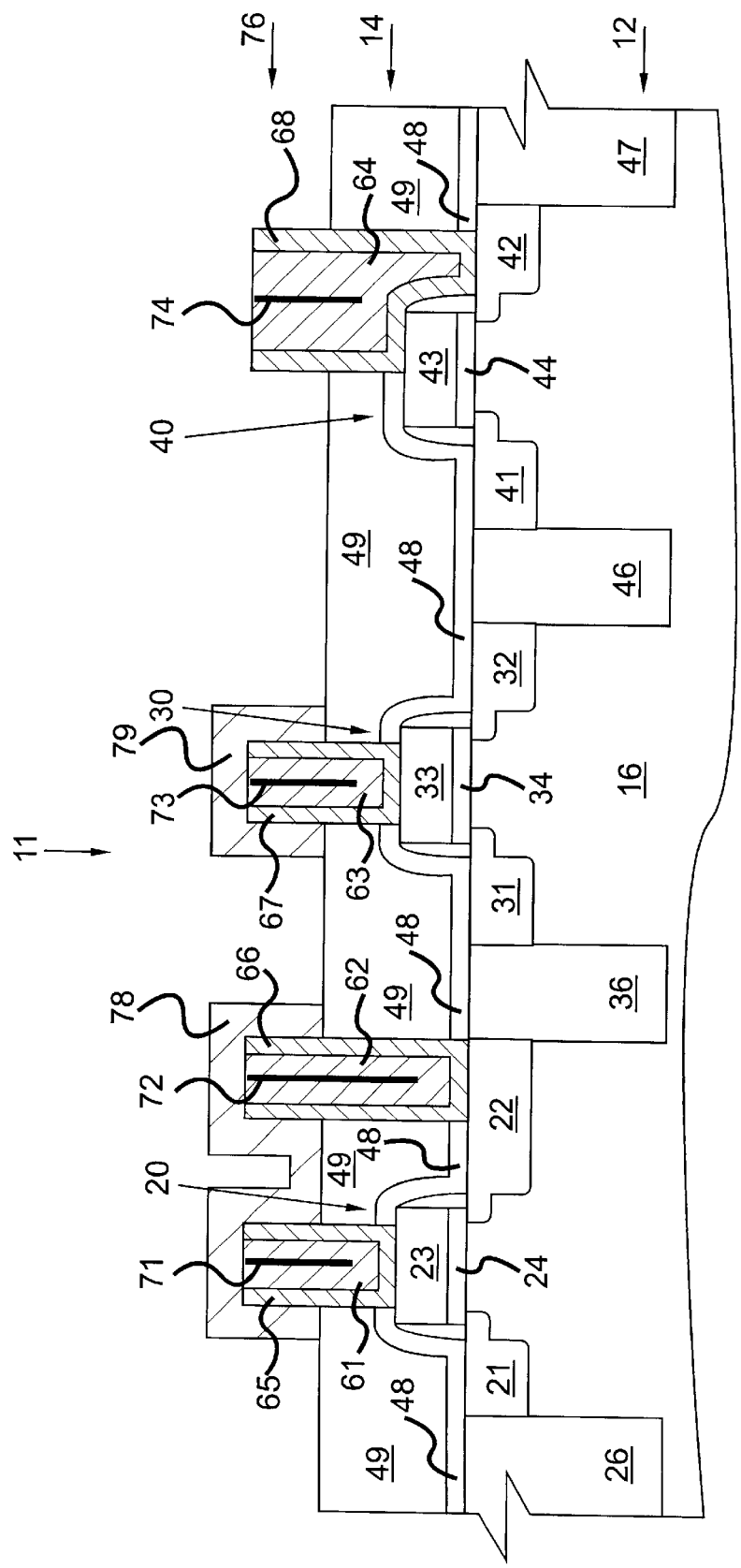
FIG. 6 depicts FIG. 5 after removal of portions of the metallic capping layer between the conductive wires/studs, forming individual metallic caps and exposing portions of the first insulative layer.

FIG. 6 illustrates FIG. 5 after removal of portions of the metallic capping material 77 between the conductive wires/studs 61, 62, 63, and 64 so as to form individual metallic caps 78 and 79 as shown, and exposing portions of the insulative layer 14. The removal of said portions of the metallic capping material 77 may be accomplished by any method known to one of ordinary skill in the art such as by, inter alia, depositing photoresist on the metallic capping material 77, patterning the photoresist with a photomask, exposing the patterned photoresist to ultraviolet radiation, developing away or otherwise removing the exposed photoresist, and etching away said portions of the metallic capping material 77.

A purpose of the removal of portions of the metallic capping material 77 is to electrically decouple the conductive wires/studs 61 and 62, 63, and 64 as shown. There is no removal of the metallic capping layer 76 between the conductive wires/studs 61 and 62, which leaves the conductive wires/studs 61 and 62 conductively coupled to each other. The portion of the metallic capping material 77 over the conductive wire/stud 64 is totally removed so as to facilitate electrical isolation of the conductive wire/stud 64 from conductive wiring (e.g., copper wiring) subsequently formed over the conductive wire/stud 64, as discussed infra in conjunction with FIG. 8. The removal of portions of the metallic capping layer 76 may be accomplished by any method known to one of ordinary skill in the art such as, inter alia, a RIE using a HCl-based chemistry, a BCl$_3$-based chemistry, a chlorine-based chemistry, a SF$_6$-based chemistry, etc. If the removal of portions of the metallic capping layer 76 is accomplished by a selective removal technique, such as selective etching, then the material of the metallic capping material 77 should differ from the material of the conductive wires/studs 61 and 62, 63, and 64. For example the metallic capping material 77 could include polysilicon while the material of the conductive wires/studs 61 and 62, 63, and 64 could include tungsten (or vice versa). The metallic caps 78 and 79 may be labeled as selective etch metallic caps, in contrast with the damascene wires/studs (i.e., the conductive wires/studs 61, 62, 63, and 64) existing within a portion of the insulative layer 14.

Figure 7:
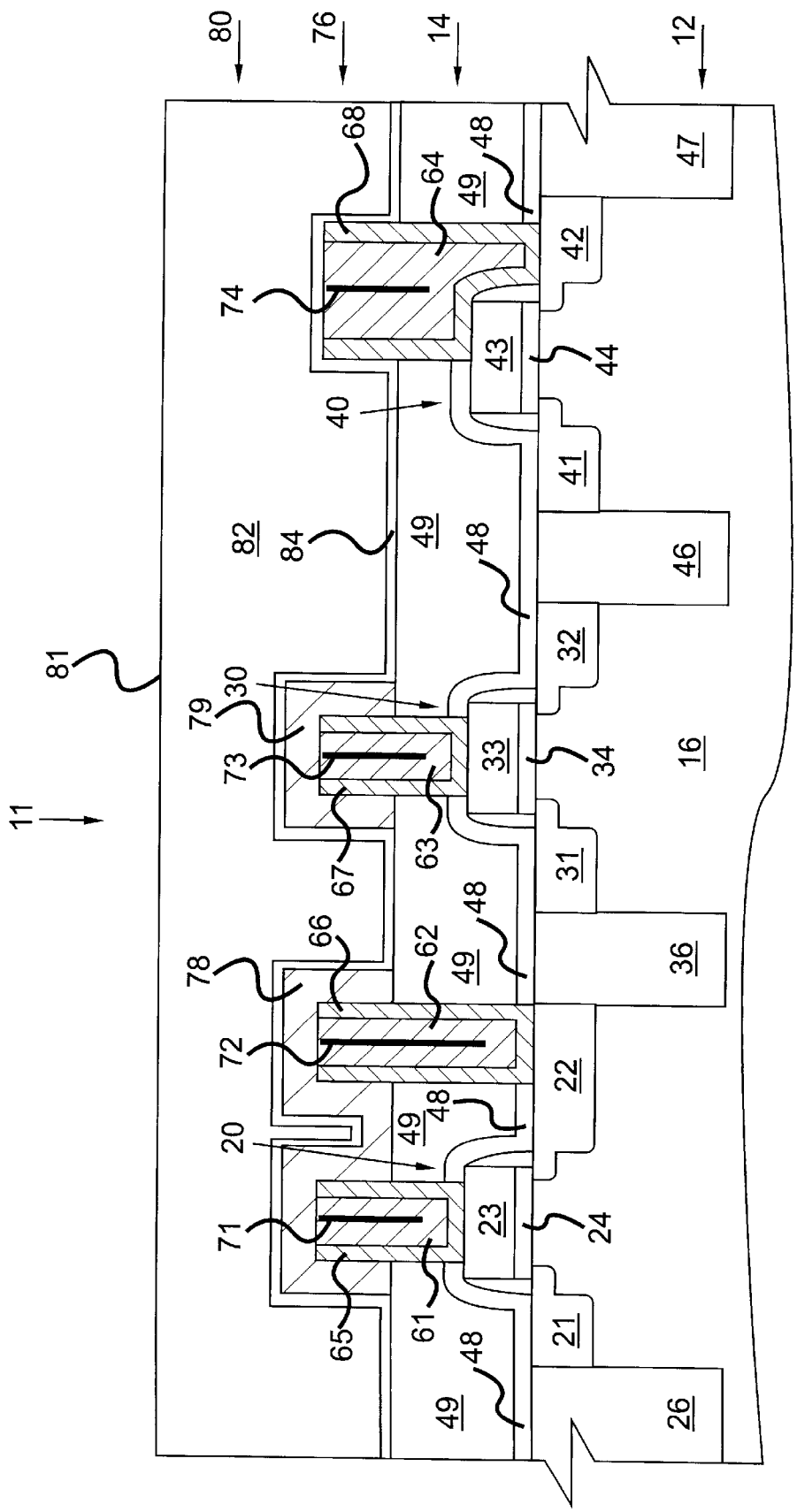
FIG. 7 depicts FIG. 6 after a second insulative layer has been formed on the first insulative layer and on the individual metallic caps, and after a top surface of the second insulative layer has been planarized.

FIG. 7 illustrates FIG. 6 after an insulative layer 80 has been formed on the insulative layer 14 and on the individual metallic caps 78 and 79. The insulative layer 80 includes an insulative material 82 such as, inter alia, silicon dioxide, SiO$_2$ doped with phosphorus or boron, spin on dielectrics, etc. Following its initial formation, the insulative layer 80 may be polished, such as by chemical mechanical polishing (CMP), or any other suitable polishing method, that planarizes the top surface 81 of the insulative layer 80. After the CMP, the insulative layer 80 has a minimum thickness of at about 100 nm.

A passivating film 84 (e.g., a silicon nitride or a silicon carbide film) may be formed on the insulative layer 14, on the individual metallic caps 78 and 79, and on the conductive wire/stud 64, prior to formation of the insulative layer 80. The passivating film 84 acts as an etch stop film which protects the insulative layer 14, the individual metallic caps 78 and 79, and the conductive wire/stud 64, from etchant associated with a subsequent etching of trenches or vias into the insulative material 82 to form damascene conductive wiring lines 91, 92, and 93 as described infra in conjunction with FIG. 8. The passivating film 84 may also act as a mobile ion barrier, and/or as a copper diffusion barrier, for protecting for protecting the substrate layer 12 and the electronic devices (i.e., the FET's 20, 30, and 40) from subsequent etching of trenches or vias into the insulative material 82 as described infra in conjunction with FIG. 8, or from moble ions (e.g., Na, Cu, etc.) diffusing into the electronic devices (i.e., the FET's 20, 30, and 40).

Figure 8:
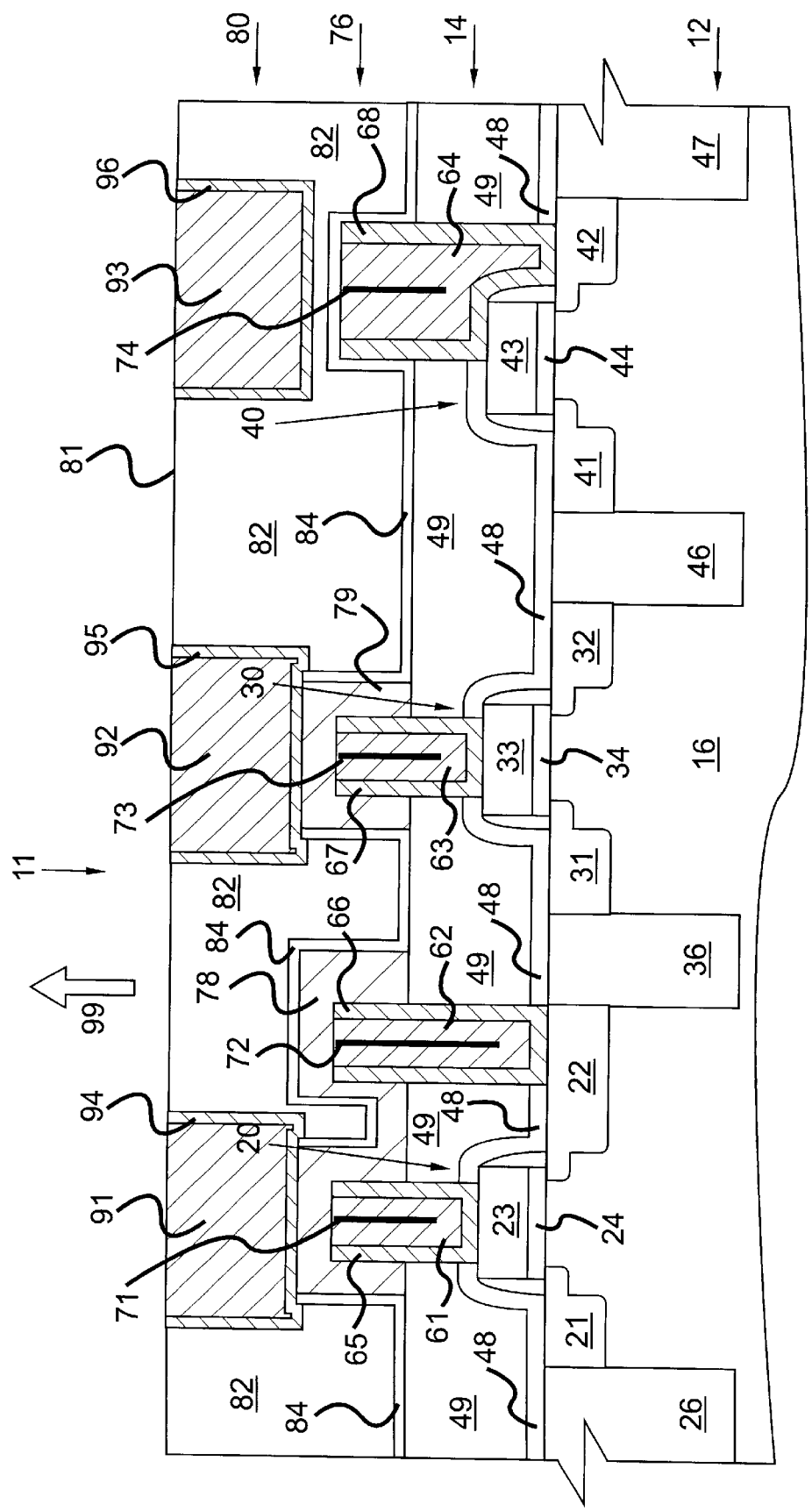
FIG. 8 depicts FIG. 7 after a damascene conductive wiring lines has been formed within the second insulative layer, wherein some of the damascene conductive wiring lines are in conductive contact with individual metallic caps.

FIG. 8 illustrates FIG. 7 after a damascene conductive wiring level 90 has been formed within the insulative layer 80. The damascene conductive wiring level 90 includes a damascene conductive wiring line 91 conductively coupled to the metallic cap 78, a damascene conductive wiring line 92 conductively coupled to the metallic cap 79, and a damascene conductive wiring line 93 not conductively coupled to the metallic capping layer 76. Additionally, conductive liners 94, 95, and 96 may be formed on the bottom and sides of the damascene conductive wiring lines 91, 92, and 93, respectively, as shown. The conductive liners 94, 95, and 96 include one or more refractory metals such as tungsten-based metals, titanium-based metals, tantalum-based metals, alloys, nitridized metals, carbides, etc., as are known in the art (e.g., titanium nitride plus tantalum).

The damascene conductive wiring line 91, together with the metallic cap 78 and the conductive wires/studs 61 and 62, conductively couple the electronic device represented by the FET 20 to other conductive structure in interlevel dielectric layers which are at or above (i.e., in the direction 99) the damascene conductive wiring level 90. The damascene conductive wiring line 92, together with the metallic cap 79 and the conductive wire/stud 63, conductively couple the electronic device represented by the FET 30 to other conductive structure in or above interlevel dielectric layers higher than (i.e., in the direction 99) the damascene conductive wiring level 90. The conductive wire/stud 64, which is in conductive isolation from the damascene conductive wiring line 93, shorts the gate 43 to the drain 42 of the electronic device represented by the FET 40. The conductive wire/stud 64 may be conductively coupled to internal conductive structure within the electronic structure 11, such as, inter alia, within the substrate level 12.

The damascene conductive wiring lines 91, 92, and 93 may include a metal such as, inter alia, copper that is suitable for wiring purposes. The metal (e.g., copper) may be formed by, inter alia, damascene electroplating (e.g., damascene copper electroplating as discussed supra in conjunction with FIGS. 3A and 3B). In contrast with the problem of the related art described supra in conjunction with FIG. 3B, the metal plating (e.g., copper plating) of the damascene conductive wiring lines 91, 92, and 93, formed such as by damascene electroplating, cannot migrate into the seams or voids 71, 72, 73, and 74 of the conductive wires/studs 61, 62, and 63. In FIG. 8, the conductive wires/studs 61, 62, and 63 are protected by the metallic caps 78 and 79 which are subtractive etch metallic caps that constitute protective barriers through which metal plating solution (e.g., copper plating solution) cannot penetrate. The conductive wire/stud 64, although not protected by a subtractive etch metallic cap, is protected from the metal plating solution (e.g., copper plating solution) associated with the conductive wiring line 93 by the insulative material 82 and the passivating film 84. Thus, the metallic caps 78 and 79 of the present invention, derived from the metallic capping layer 76, solve the problem of the related art by preventing metal plating solution (e.g., copper plating solution) originating at the damascene conductive wiring level 90 from deforming, damaging, or blowing up the conductive wires/studs 61, 62, and 63 located below the damascene conductive wiring level 90.

An additional benefit of the present invention is that the damascene conductive wiring line 93 has been formed in conductive isolation from the conductive stud 64 without additional processing steps, because an insulative gap 98 between the conductive wiring line 93 and the conductive wire/stud 64 is a free byproduct of the process of the present invention Without the metallic capping layer 76 of the present invention, the damascene conductive wiring line 93 requires extra processing steps, such as depositing a dielectric layer on the conductive wire/stud 64, applying photoresist on the dielectric layer, patterning the photoresist such as by masking, radiatively exposing the patterned photoresist, and etching the dielectric layer to form a trench or via of desired depth in the dielectric layer into which the damascene conductive wiring line 93 could be deposited.

Figure 9:
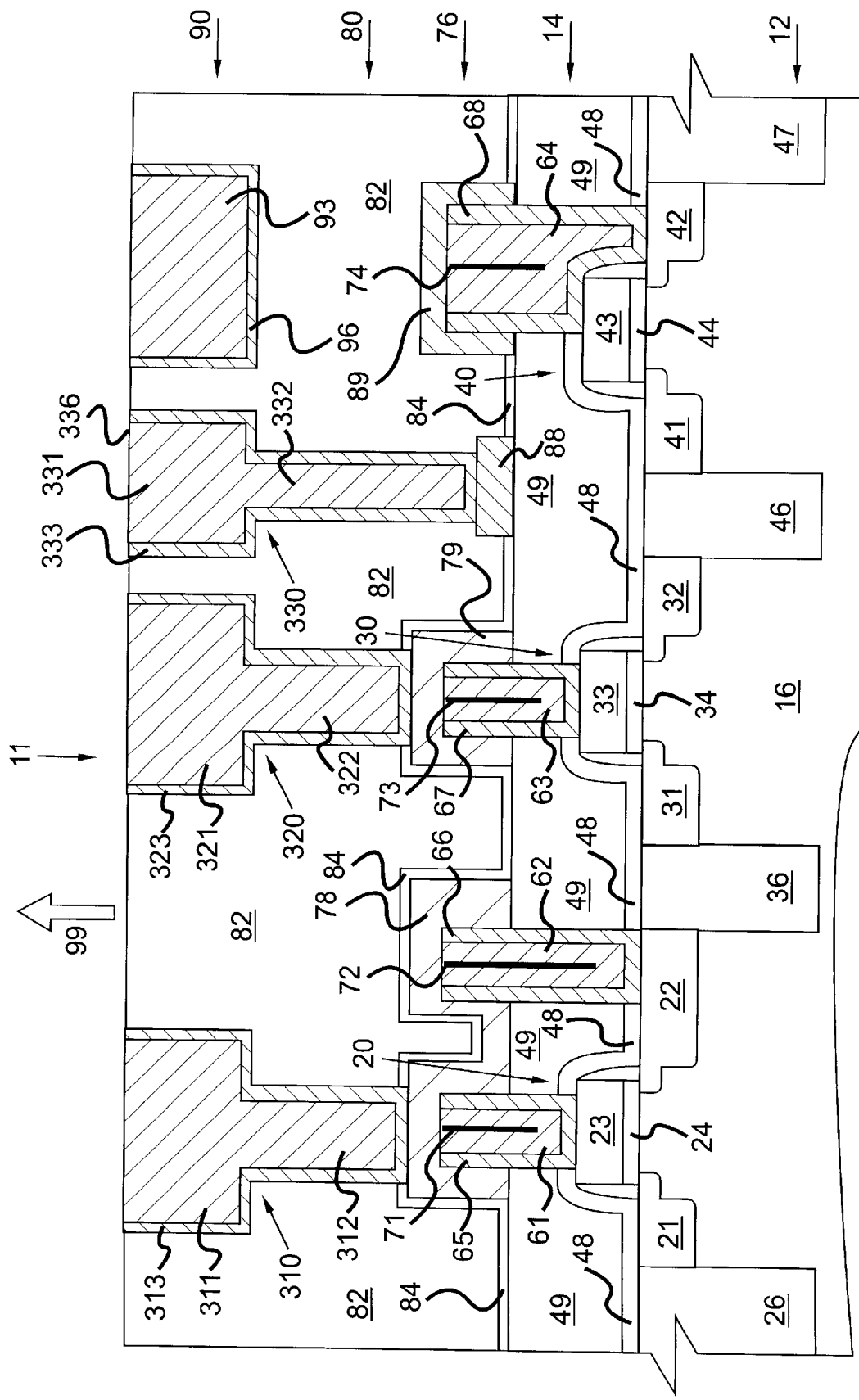
FIG. 9 depicts FIG. 8 with the damascene conductive wiring lines replaced by dual damascenes.

FIG. 9 illustrates FIG. 8 with the damascene conductive wiring lines 91 and 92 replaced by dual damascenes 310 and 320, respectively. A dual damascene includes a conductive wiring line and a metallized via which have been fabricated together. Accordingly, the dual damascene 310, which is conductively coupled to the metallic cap 78, includes a conductive wiring line 311 and a metallized via 312 which have been fabricated together. Similarly, the dual damascene 320, which conductively contacts the metallic cap 79, includes a conductive wiring line 321 and the metallized via 322 which have been fabricated together. The dual damascenes 310 and 320 are within conductive liners 313 and 323, respectively.

FIG. 9 also illustrates an additional dual damascene 330, which includes a conductive wiring line 311 that has been fabricated together with a metallized via 312. The metallized via 312 of the dual damascene 330 contacts a metallic cap 88. The metallic cap 88 is formed during the same etching step that forms the metallic caps 78 and 79, as was described supra in conjunction with FIG. 6. The metallic cap 88 may be part of an underpass structure. The underpass structure may be later conductively coupled by the dual damascene 330 to other conductive structure or devices located above the dual damascene 330 (i.e., conductive structure or devices above a surface 336 of the wiring line 311 in the direction 99).

The dual damascenes 310, 320, and 330 may each be fabricated by any method known to one of ordinary skill in the art.

Because of the vertical space (i.e., height in the direction 99) occupied by the metallized vias 312 and 322, the damascene conductive wiring line 93 in FIG. 9 has been displaced away from the conductive wire/stud 64 in the direction 99, which increases the height (in the direction 99) of the insulative gap 98 as compared with the height of the corresponding insulative gap 98 in FIG. 8. As a result of said increase in height of the insulative gap 98 in FIG. 9, it is not necessary to remove the portion of the metallic capping material 77 (see FIG. 5) that is over the conductive wire/stud 64. Accordingly, FIG. 9 shows a metallic cap 89 over the conductive wire/stud 64 as a result of the step of etching the metallic cap 77 that was described supra in conjunction with FIG. 6.

Definitionally, a "damascene conductive wiring line structure" is defined herein as a damascene conductive wiring line (e.g., the damascene conductive wiring line 91, 92, or 93 of FIG. 8) or a dual damascenes (e.g., the dual damascene 310, 320, or 330 of FIG. 9).

Figure 1:
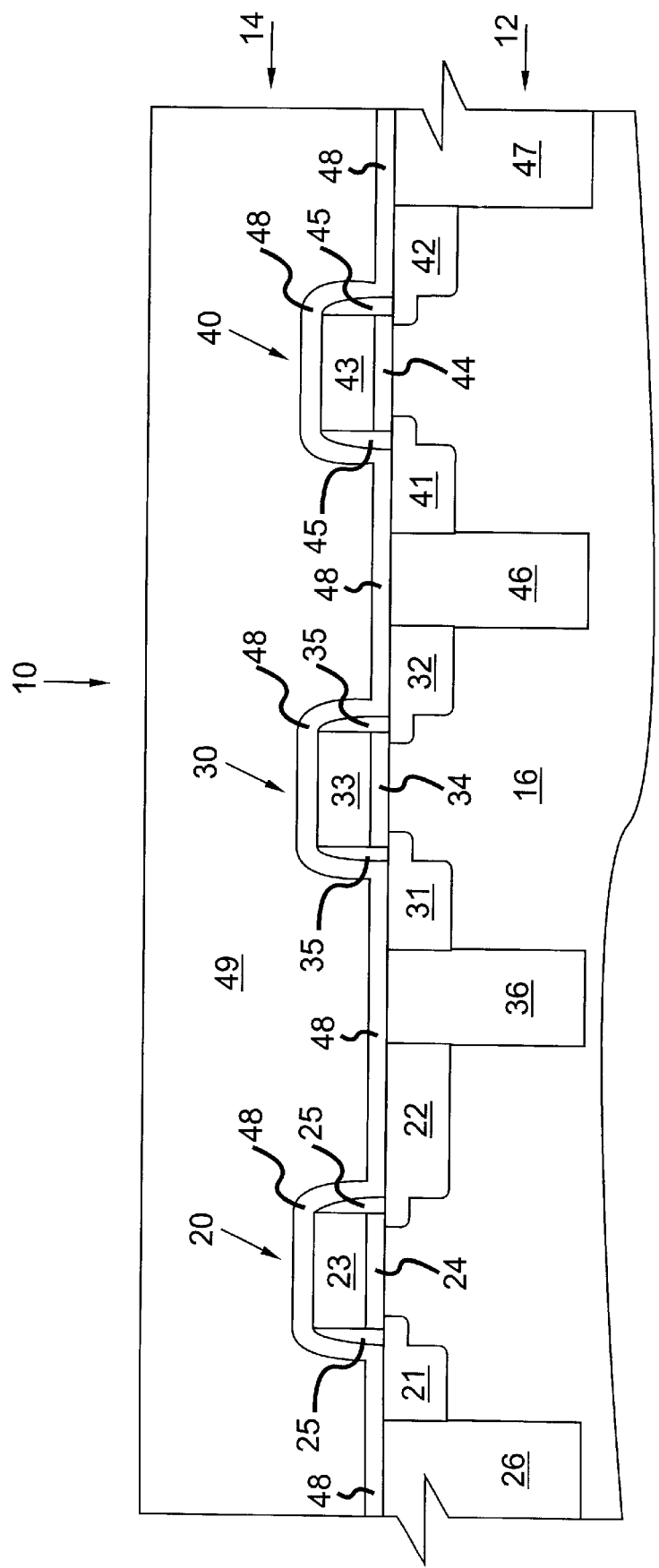
FIG. 1 depicts a front cross-sectional view of a first electronic structure having a first insulative layer on a substrate layer, wherein the first insulative layer covers electronic devices that exist within the substrate, in accordance with the related art.
Figure 2:
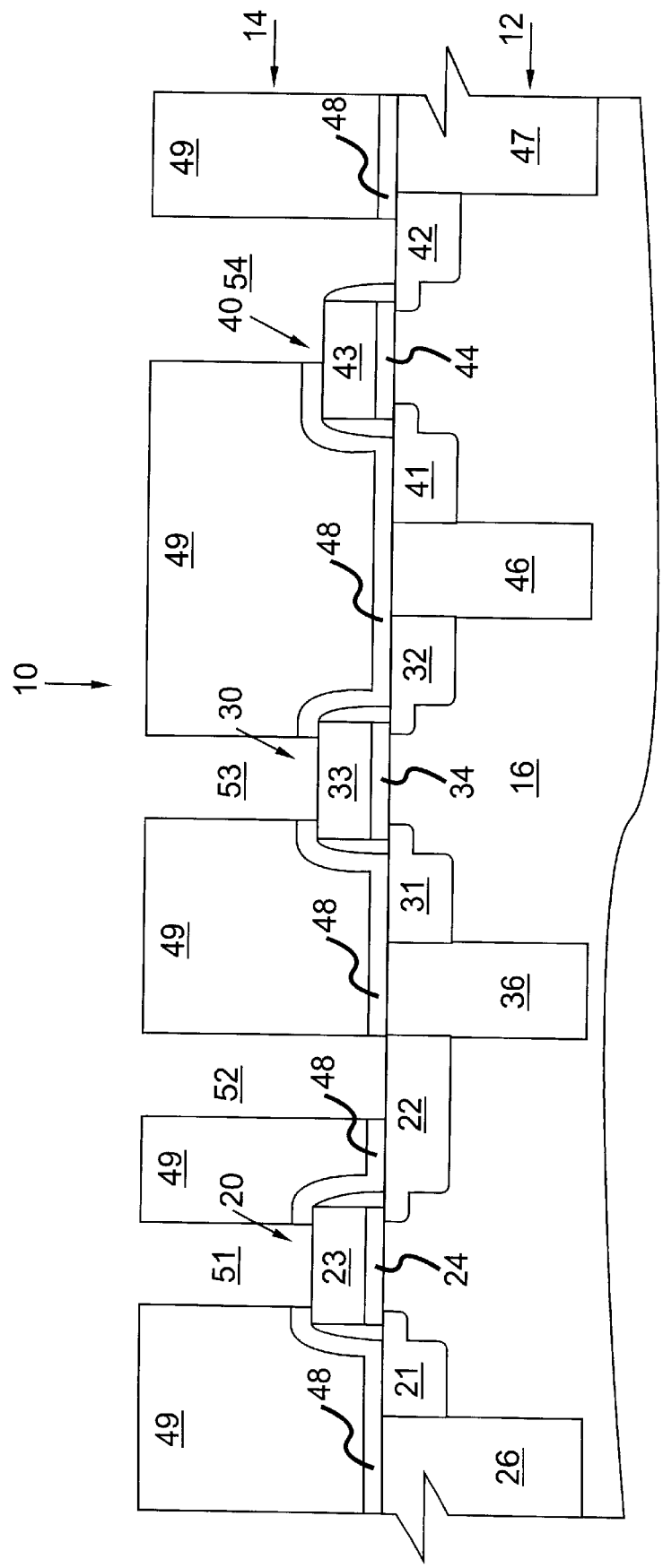
FIG. 2 depict FIG. 1 after trenches or vias have been etched in the first insulative layer, exposing a portion of each electronic device.
Figure 10:
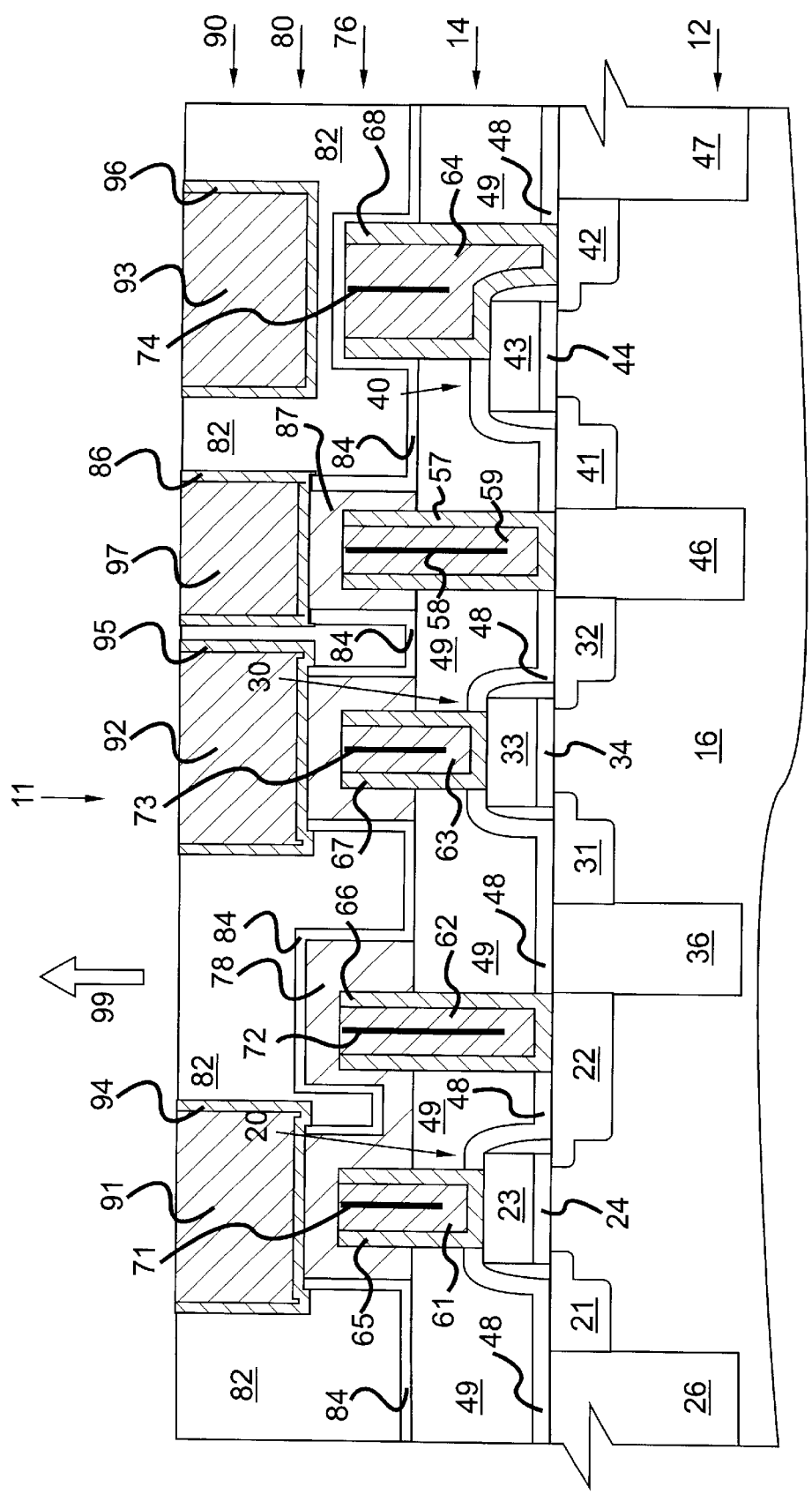
FIG. 10 depicts FIG. 8 with an additional conductive wire/stud having a seam or void, wherein the additional conductive wire/stud is on a shallow trench isolation within the substrate layer, wherein an additional metallic cap is on the additional conductive wire/stud, and wherein an additional damascene conductive wiring lines has been formed within the second insulative layer and on the additional metallic cap.

FIG. 10 illustrates FIG. 8 with a conductive wire/stud 59 having a conductive liner 57 and a seam or void 58, wherein the conductive wire/stud 59 is on the shallow trench isolation 28 within the substrate layer 16, wherein a metallic cap 87 is on the conductive wire/stud 59, and wherein a damascene conductive wiring line 97 has been formed within the second insulative layer 80 and is conductively coupled to the metallic cap 87. The damascene conductive wiring line 97 is within a conductive liner 86. The conductive wire/stud 59 has similar physical and chemical properties, and may be similarly formed, as described supra in conjunction with FIGS. 1 and 3A for the conductive wires/studs 61, 62, 63, and 64. The metallic cap 87 has similar physical and chemical properties, and may be similarly formed, as described supra in conjunction with FIG. 6 for the metallic caps 78 and 79. The damascene conductive wiring line 97 has similar physical and chemical properties, and may be similarly formed, as described supra in conjunction with FIG. 8 for the damascene conductive wiring lines 91, 92, and 93.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

We claim:

1. An electronic structure, comprising:
   a substrate layer that includes a first electronic device;
   a passivating layer on the substrate layer and in mechanical contact with the substrate layer, wherein the passivating layer is on the first electronic device and is in mechanical contact with the first electronic device;
   a first insulative layer on the passivating layer and in mechanical contact with the passivating layer;
   a first damascene conductive wire/stud having a lower portion in the first insulative layer and an upper portion above the first insulative layer;
   a subtractive etch metallic cap on the upper portion of the first damascene conductive wire/stud and in conductive contact with the first damascene conductive wire/stud;
   a second insulative layer on the first insulative layer, wherein the second insulative layer covers the subtractive etch metallic cap; and
   a damascene conductive wiring line structure within the second insulative layer such that the damascene conductive wiring line structure is above the subtractive etch metallic cap and is conductively coupled to the subtractive etch metallic cap.

2. The electronic structure of claim 1, wherein the lower portion of the first damascene conductive wire/stud is conductively coupled to a first portion of the first electronic device.

3. The electronic structure of claim 2, further comprising a second damascene conductive wire/stud having a lower portion in the first insulative layer and an upper portion above the first insulative layer, wherein the lower portion of the second damascene conductive wire/stud is conductively coupled to a second portion of the first electronic device, and wherein the subtractive etch metallic cap is in conductive contact with the second damascene conductive wire/stud.

4. The electronic structure of claim 3, wherein the first electronic device is a field effect transistor (FET), wherein the first portion of the first electronic device includes a gate of the FET, and wherein the second portion of the first electronic device is selected from the group consisting of a source of the FET and a drain of the FET.

5. The electronic structure of claim 2, wherein the first electronic device is selected from the group consisting of an MOS capacitor, a resistor, an inductor, a charged coupled device, and a light emitting diode.

6. The electronic structure of claim 2, wherein the substrate layer further comprises a second electronic device, and wherein the electronic structure further comprises:
   a second damascene conductive wire/stud having a lower portion in the first insulative layer and an upper portion above the first insulative layer, wherein the lower portion of the second damascene conductive wire/stud is conductively coupled to the second electronic device; and
   a damascene conductive wiring line within the second insulative layer, wherein the damascene conductive wiring line is above the second damascene conductive wire/stud and is insulatively isolated from the second damascene conductive wire/stud.

7. The electronic structure of claim 6, further comprising a second subtractive etch metallic cap on the upper portion of the second damascene conductive wire/stud and in conductive contact with the second damascene conductive wire/stud.

8. The electronic structure of claim 1, wherein the substrate includes a shallow trench isolation (STI), and wherein the lower portion of the first damascene conductive wire/stud is on the STI.

9. The electronic structure of claim 1, further comprising:
   a second subtractive etch metallic cap on the first insulative layer; and
   a dual damascene within the second insulative layer such that the dual damascene is above the second subtractive etch metallic cap and is conductively coupled to the second subtractive etch metallic cap.

10. The electronic structure of claim 1, wherein the subtractive etch metallic cap has a thickness between about 50 nm and about 300 nm.

11. The electronic structure of claim 1, wherein the subtractive etch metallic cap includes an electrically conductive material selected from the group consisting of tungsten, tantalum, titanium nitride, aluminum with copper doping, tantalum nitride, tungsten nitride, gold, silver, platinum, copper, palladium, and combinations thereof.

12. The electronic structure of claim 1, wherein the first damascene conductive wire/stud includes an internal seam or void oriented lengthwise within the first damascene conductive wire/stud.

13. The electronic structure of claim 1, wherein the subtractive etch metallic cap includes a first electrically conductive material, and wherein the first damascene conductive wire/stud includes a second electrically conductive material which differs from the first electrically conductive material.

14. The electronic structure of claim 13, wherein the first electrically conductive material is selected from the group consisting of tungsten, tantalum, titanium nitride, aluminum with copper doping, tantalum nitride, tungsten nitride, gold, silver, platinum, copper, palladium, alloys thereof, and combinations thereof, and wherein the second electrically conductive material is selected from the group consisting of polysilicon, tungsten, aluminum, copper, tantalum, and titanium nitride, alloys thereof, and combinations thereof.

15. The electronic structure of claim 1, wherein the subtractive etch metallic cap includes an electrically conductive material selected from the group consisting of tungsten, tantalum, titanium nitride, aluminum with copper doping, tantalum nitride, tungsten nitride, copper, and combinations thereof.

16. The electronic structure of claim 1, wherein the distance between a top surface of the first damascene conductive wire/stud and a top surface of the first insulative layer is between about 100 nm and about 400 nm.

17. The electronic structure of claim 1, wherein the first insulative layer has a thickness that is greater than 250 nm.

18. The electronic structure of claim 1, further comprising a passivating film disposed between the first insulative layer and the second insulative layer.

19. The electronic structure of claim 18, wherein the passivating film is in contact with the subtractive etch metallic cap.

20. The electronic structure of claim 1, wherein the damascene conductive wiring line structure comprises a damascene conductive wiring line and a conductive liner formed on sides of the damascene conductive wiring line.

21. The electronic structure of claim 1, wherein the damascene conductive wiring line structure together with the subtractive etch mechanical cap and the first damascene conductive wire/stud are adapted to collectively couple the first electronic device to other conductive structure in interlevel dielectric layers which are at or above the damascene conductive wiring line structure.

22. The electronic structure of claim 1, wherein the damascene conductive wiring line structure comprises a dual damascene in contact with the subtractive etch metallic cap.

23. The electronic structure of claim 3, wherein the damascene conductive wiring line structure comprises a dual damascene in contact with the subtractive etch metallic cap.

24. The electronic structure of claim 1, wherein the passivating layer comprises a material selected from the group consisting of silicon nitride and silicon carbide.

25. The electronic structure of claim 1, wherein the first insulation layer comprises a material selected from the group consisting of phososilicate glass and borophososilicate glass.

26. The electronic structure of claim 1, wherein the first insulation layer has a thickness between about 0.2 microns and about 1.5 microns.

27. An electronic structure, comprising:

a substrate layer that includes a first electronic device;

a first insulative layer on the passivating layer and in mechanical contact with the passivating layer, wherein the first insulation layer has a thickness between about 0.2 microns and about 1.5 microns;

a first damascene conductive wire/stud having a lower portion in the first insulative layer and an upper portion above the first insulative layer;

a subtractive etch metallic cap on the upper portion of the first damascene conductive wire/stud and in conductive contact with the first damascene conductive wire/stud;

a second insulative layer on the first insulative layer, wherein the second insulative layer covers the subtractive etch metallic cap; and a damascene conductive wiring line structure within the second insulative layer such that the damascene conductive wiring line structure is above the subtractive etch metallic cap and is conductively coupled to the subtractive etch metallic cap.

28. An electronic structure, comprising:

a substrate layer that includes a first electronic device;

a first insulative layer on the passivating layer and in mechanical contact with the passivating layer, wherein the first insulation layer comprises a material selected from the group consisting of phososilicate glass and borophososilicate glass;

a first damascene conductive wire/stud having a lower portion in the first insulative layer and an upper portion above the first insulative layer;

a subtractive etch metallic cap on the upper portion of the first damascene conductive wire/stud and in conductive contact with the first damascene conductive wire/stud;

a second insulative layer on the first insulative layer, wherein the second insulative layer covers the subtractive etch metallic cap; and a damascene conductive wiring line structure within the second insulative layer such that the damascene conductive wiring line structure is above the subtractive etch metallic cap and is conductively coupled to the subtractive etch metallic cap.

* * * * *